(12) United States Patent
Lee et al.

(10) Patent No.: US 10,079,101 B2
(45) Date of Patent: Sep. 18, 2018

(54) MULTILAYER CERAMIC CAPACITOR AND BOARD HAVING THE SAME

(71) Applicant: SAMSUNG ELECTRO-MECHANICS CO., LTD., Suwon-si, Gyeonggi-do (KR)

(72) Inventors: Kyo Kwang Lee, Suwon-si (KR); Jin Kim, Suwon-si (KR); Young Ghyu Ahn, Suwon-si (KR); Chang Su Kim, Suwon-si (KR)

(73) Assignee: SAMSUNG ELECTRO-MECHANICS CO., LTD., Suwon-si, Gyeonggi-Do (KR)

( * ) Notice: Subject to any disclaimer, the term of this patent is extended or adjusted under 35 U.S.C. 154(b) by 44 days.

(21) Appl. No.: 15/054,842

(22) Filed: Feb. 26, 2016

(65) Prior Publication Data

US 2017/0062133 A1    Mar. 2, 2017

(30) Foreign Application Priority Data

Aug. 26, 2015 (KR) .................. 10-2015-0120145

(51) Int. Cl.
| | |
|---|---|
| *H01G 4/228* | (2006.01) |
| *H01G 4/30* | (2006.01) |
| *H01G 4/012* | (2006.01) |
| *H01G 4/224* | (2006.01) |
| *H01G 4/232* | (2006.01) |

(Continued)

(52) U.S. Cl.
CPC ............. *H01G 4/30* (2013.01); *H01G 4/012* (2013.01); *H01G 4/224* (2013.01); *H01G 4/232* (2013.01);
(Continued)

(58) Field of Classification Search
CPC .................................................... H01G 4/228
(Continued)

(56) References Cited

U.S. PATENT DOCUMENTS

| | | | |
|---|---|---|---|
| 6,243,253 B1 * | 6/2001 | DuPre .................... | H01G 2/065 361/301.4 |
| 2004/0266087 A1 | 12/2004 | Greier et al. | |

(Continued)

FOREIGN PATENT DOCUMENTS

| | | |
|---|---|---|
| JP | 10-50545 A | 2/1998 |
| JP | 2005-505129 A | 2/2005 |

(Continued)

OTHER PUBLICATIONS

Notice of Office Action dated Jan. 13, 2017, in corresponding Korean Patent Application No. 10-2015-0120145 with English language translation.

*Primary Examiner* — Hoa C Nguyen
*Assistant Examiner* — Stanley Tso
(74) *Attorney, Agent, or Firm* — McDermott Will & Emery LLP

(57) ABSTRACT

A multilayer ceramic capacitor includes a ceramic body having a plurality of dielectric layers stacked therein, and first and second internal electrodes alternately disposed with at least one among the plurality of dielectric layers interposed therebetween. The first internal electrodes include first and second lead portions exposed to a mounting surface of the ceramic body, and disposed to be spaced apart from each other in a length direction of the ceramic body. The second internal electrodes include a third lead portion exposed to the mounting surface of the ceramic body, and disposed between the first and second lead portions in the length direction of the ceramic body.

17 Claims, 13 Drawing Sheets

(51) Int. Cl.
*H05K 1/18* (2006.01)
*H05K 1/11* (2006.01)
*H05K 1/02* (2006.01)
*H05K 3/34* (2006.01)

(52) U.S. Cl.
CPC ............ *H05K 1/0231* (2013.01); *H05K 1/111* (2013.01); *H05K 1/181* (2013.01); *H05K 3/3431* (2013.01); *H05K 2201/10015* (2013.01)

(58) Field of Classification Search
USPC .......................................................... 174/260
See application file for complete search history.

(56) References Cited

U.S. PATENT DOCUMENTS

| | | | |
|---|---|---|---|
| 2008/0186652 A1 | 8/2008 | Lee et al. | |
| 2010/0149769 A1* | 6/2010 | Lee | H01G 2/065 361/768 |
| 2010/0188799 A1* | 7/2010 | Galvagni | H01G 4/012 361/306.3 |
| 2011/0013341 A1* | 1/2011 | Park | H01G 4/005 361/313 |
| 2013/0050897 A1 | 2/2013 | Kim | |
| 2013/0058006 A1* | 3/2013 | Kim | H01G 4/12 361/321.2 |
| 2013/0250476 A1* | 9/2013 | Chung | H01G 4/30 361/303 |
| 2015/0090485 A1 | 4/2015 | Lee et al. | |
| 2016/0099108 A1* | 4/2016 | Koide | H01G 4/30 361/301.4 |

FOREIGN PATENT DOCUMENTS

| | | |
|---|---|---|
| JP | 2006-086359 A | 3/2006 |
| JP | 2013-055320 A | 3/2013 |
| KR | 10-2008-0073193 A | 8/2008 |
| KR | 10-2013-0025595 A | 3/2013 |
| KR | 2015-0039090 A | 4/2015 |

* cited by examiner

MULTILAYER CERAMIC CAPACITOR AND BOARD HAVING THE SAME

CROSS-REFERENCE TO RELATED APPLICATIONS

This application claims the benefit of priority to Korean Patent Application No. 10-2015-0120145, filed on Aug. 26, 2015 with the Korean Intellectual Property Office, the entirety of which is incorporated herein by reference.

TECHNICAL FIELD

The present disclosure relates to a multilayer ceramic capacitor and a board having the same.

BACKGROUND

In accordance with the recent trend towards miniaturization and increased levels of capacitance in electronic products, demand has increased for electronic components used in electronic products having a small size and high capacitance.

When the equivalent series inductance (hereinafter referred to as "ESL") of a multilayer ceramic capacitor increases, the performance of the electronic product incorporating the multilayer ceramic capacitor may deteriorate. In addition, in accordance with the miniaturization and increased capacitance of the applied electronic component, an increase in ESL of the multilayer ceramic capacitor may more significantly deteriorate the performance of the electronic product.

Particularly, in accordance with an increase in performance of integrated circuits (ICs), decoupling capacitors have increasingly been used. Therefore, demand for multilayer ceramic capacitors (MLCCs) having a three-terminal vertical multilayer structure, so-called "low inductance chip capacitors (LICC)", capable of decreasing inductance in capacitors by decreasing a distance between external terminals to decrease a current flow path, has increased.

SUMMARY

An aspect of the present inventive concept provides a multilayer ceramic capacitor having increased capacitance with significantly reduced ESL characteristics, and a board having the same.

Another aspect of the present inventive concept provides a multilayer ceramic capacitor having a three-terminal vertical multilayer structure in which external electrodes are disposed on a mounting surface of a ceramic body to be spaced apart from each other, internal electrodes being extended to be exposed to a surface opposing the mounting surface of the ceramic body, an insulating layer being formed on the surface opposing the mounting surface of the ceramic body, and a board having the same.

BRIEF DESCRIPTION OF THE DRAWINGS

The above and other aspects, features and other advantages of the present inventive concept will be more clearly understood from the following detailed description taken in conjunction with the accompanying drawings, in which.

DETAILED DESCRIPTION

Figure 1A:
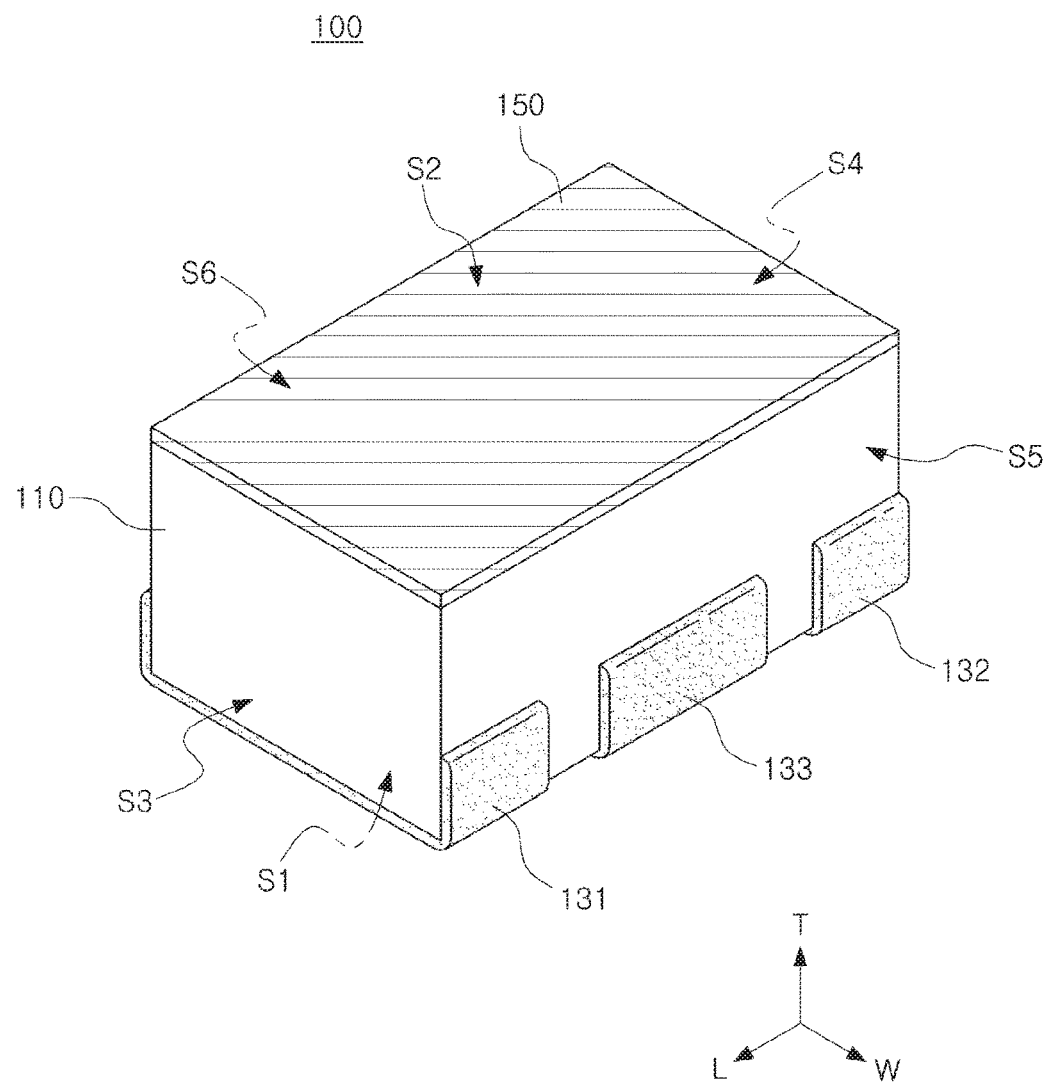
FIGS. 1A and 1B are perspective views schematically illustrating a multilayer ceramic capacitor according to an exemplary embodiment of the present inventive concept.

Hereinafter, embodiments of the present inventive concept will be described as follows with reference to the attached drawings.

The present inventive concept may, however, be exemplified in many different forms and should not be construed as being limited to the specific embodiments set forth herein. Rather, these embodiments are provided so that this disclosure will be thorough and complete, and will fully convey the scope of the disclosure to those skilled in the art.

Throughout the specification, it will be understood that when an element, such as a layer, region or wafer (substrate), is referred to as being "on," "connected to," or "coupled to" another element, it can be directly "on," "connected to," or "coupled to" the other element or other elements intervening therebetween may be present. In contrast, when an element is referred to as being "directly on," "directly connected to," or "directly coupled to" another element, there may be no elements or layers intervening therebetween. Like numerals refer to like elements throughout. As used herein, the term "and/or" includes any and all combinations of one or more of the associated listed items.

It will be apparent that though the terms first, second, third, etc. may be used herein to describe various members, components, regions, layers and/or sections, these members, components, regions, layers and/or sections should not be limited by these terms. These terms are only used to distinguish one member, component, region, layer or section from another region, layer or section. Thus, a first member, component, region, layer or section discussed below could be termed a second member, component, region, layer or section without departing from the teachings of the exemplary embodiments.

Spatially relative terms, such as "above," "upper," "below," and "lower" and the like, may be used herein for ease of description to describe one element's relationship to another element(s) as shown in the figures. It will be understood that the spatially relative terms are intended to encompass different orientations of the device in use or operation in addition to the orientation depicted in the figures. For example, if the device in the figures is inverted, elements described as "upper," or "above" other elements would then be oriented "lower," or "below" the other elements or features. Thus, the term "above" can encompass both the above and below orientations depending on a particular direction of the figures. The device may be otherwise oriented (rotated 90 degrees or at other orientations) and the spatially relative descriptors used herein may be interpreted accordingly.

The terminology used herein is for describing particular embodiments only and is not intended to be limiting of the present inventive concept. As used herein, the singular forms "a," "an," and "the" are intended to include the plural forms as well, unless the context clearly indicates otherwise. It will be further understood that the terms "comprises," and/or "comprising" when used in this specification, specify the presence of stated features, integers, steps, operations, members, elements, and/or groups thereof, but do not preclude the presence or addition of one or more other features, integers, steps, operations, members, elements, and/or groups thereof.

Hereinafter, embodiments of the present inventive concept will be described with reference to schematic views illustrating embodiments of the present inventive concept. In the drawings, for example, due to manufacturing techniques and/or tolerances, modifications of the shape shown may be estimated. Thus, embodiments of the present inventive concept should not be construed as being limited to the particular shapes of regions shown herein, for example, to include a change in shape results in manufacturing. The following embodiments may also be constituted by one or a combination thereof.

The contents of the present inventive concept described below may have a variety of configurations and propose only a required configuration herein, but are not limited thereto.

Directions of a hexahedron will be defined in order to clearly describe exemplary embodiments in the present inventive concept. L, W and T shown in FIG. 1 refer to a length direction, a width direction, and a thickness direction, respectively. Here, the width direction may be used to have the same concept as a direction in which dielectric layers are stacked.

Multilayer Ceramic Capacitor

Figure 1B:
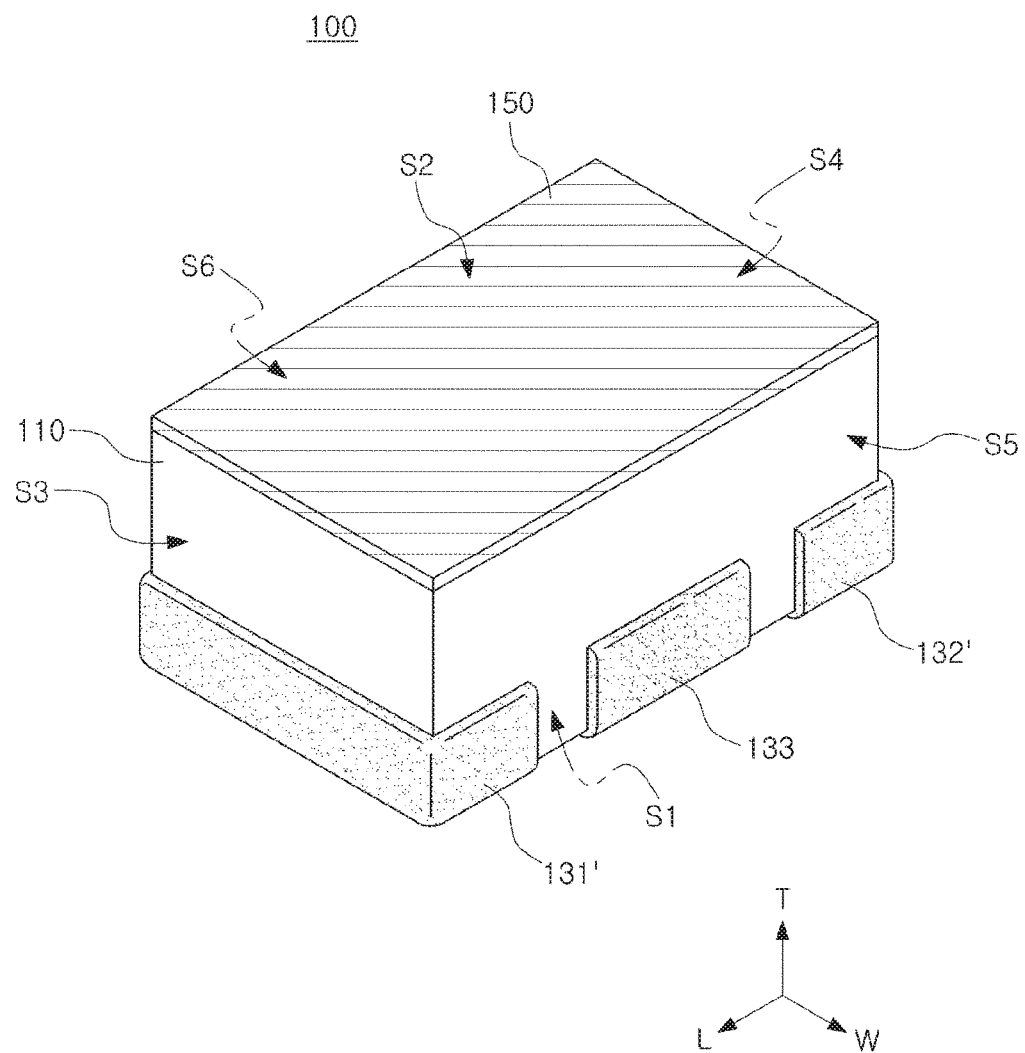
Figure 2:
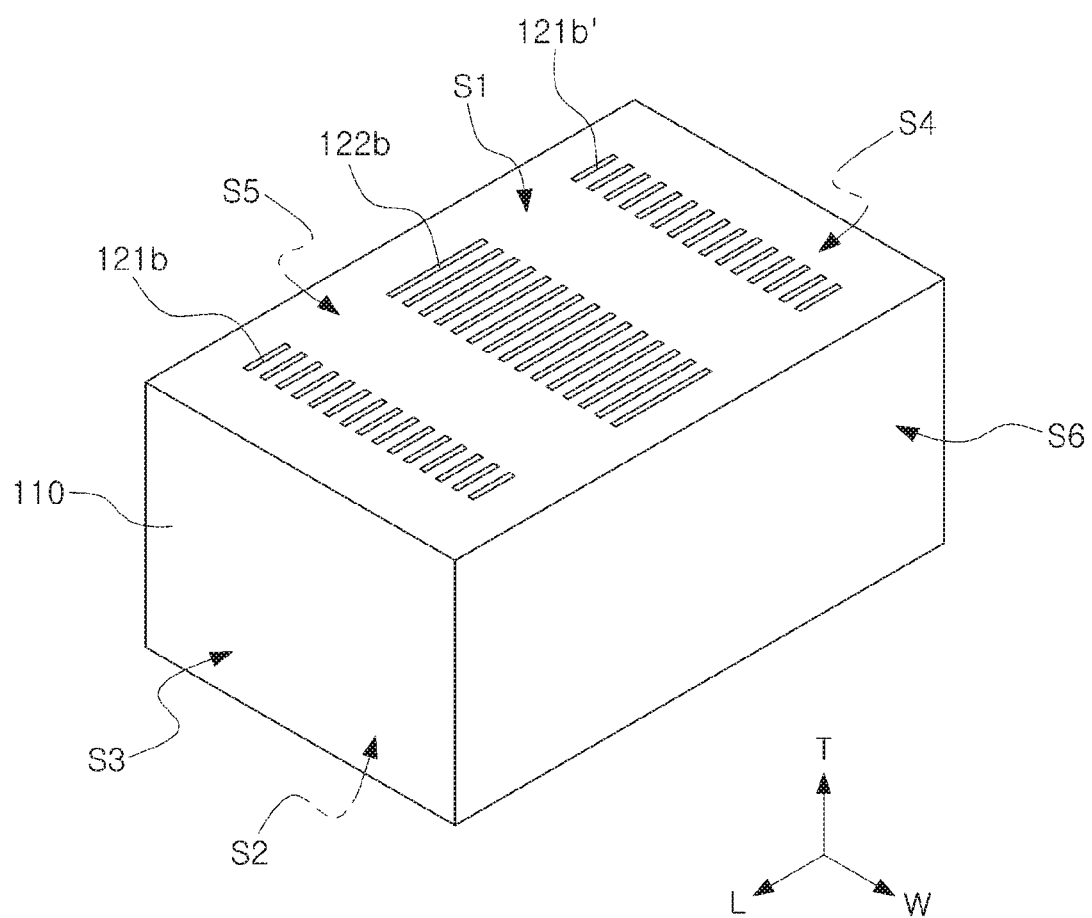
FIG. 2 is a perspective view illustrating a ceramic body of the multilayer ceramic capacitor of FIG. 1A in a state in which the ceramic body is inverted.
Figure 3:
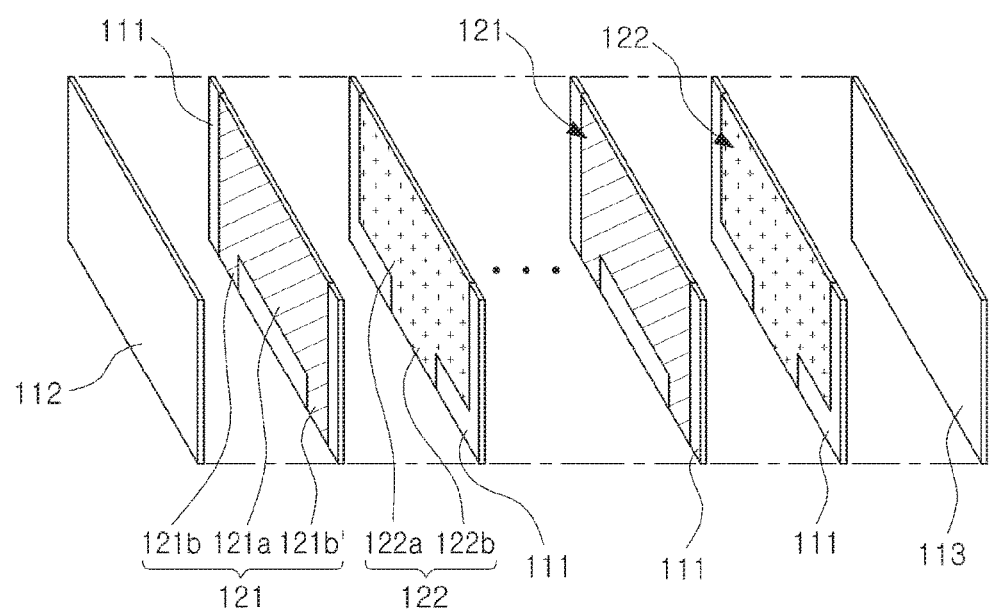
FIG. 3 is an exploded perspective view schematically illustrating a stacked structure of internal electrodes in the multilayer ceramic capacitor of FIG. 1A.
Figure 4A:
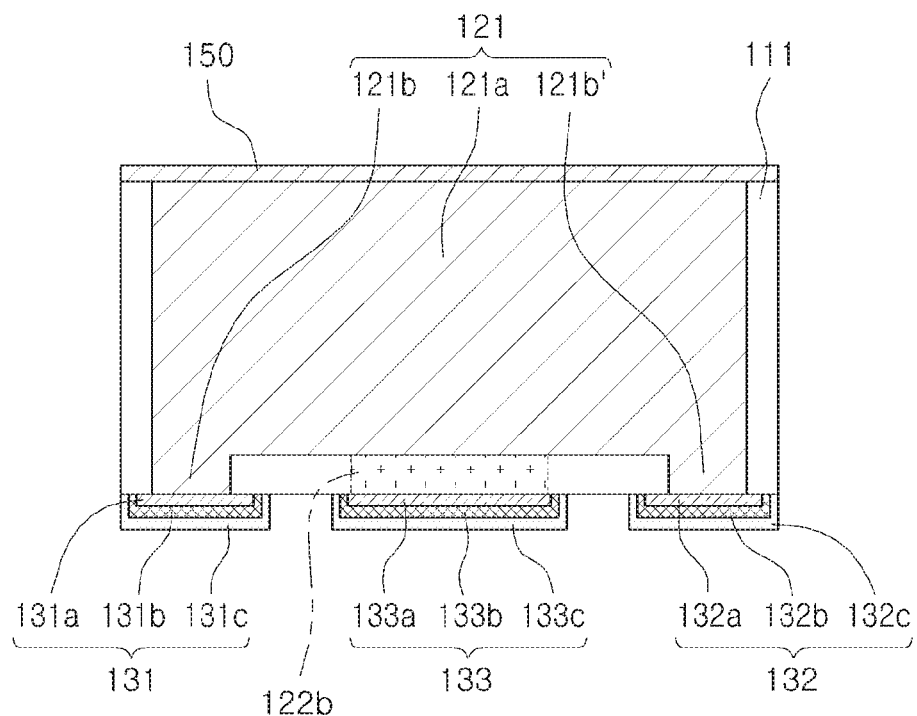
FIGS. 4A and 4B are cross-sectional views respectively illustrating the multilayer ceramic capacitor of FIG. 1A.
Figure 4B:
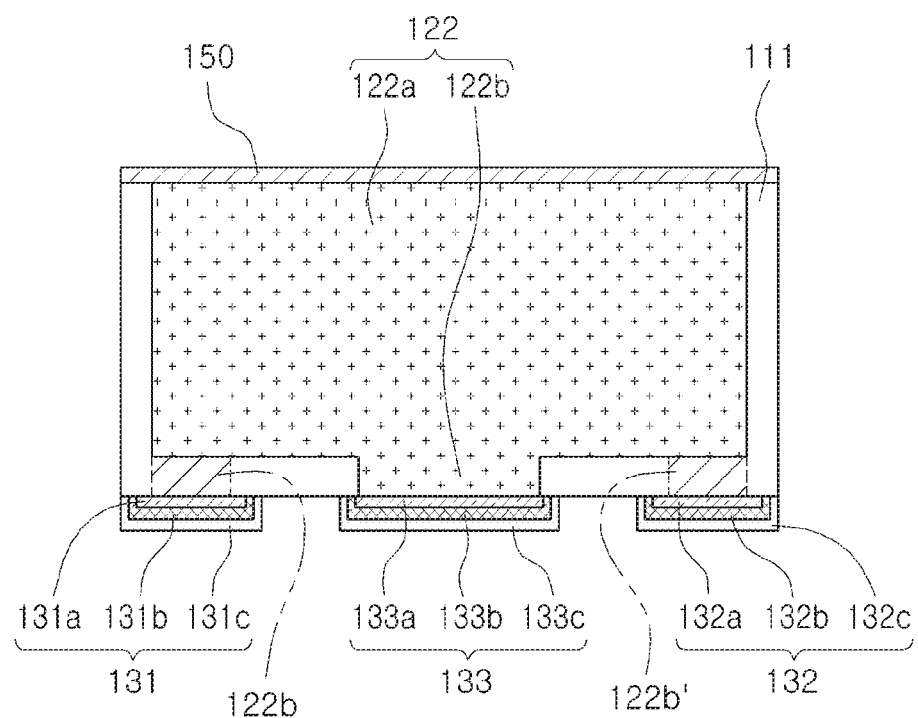

FIG. 1A and FIG. 1B are perspective views schematically illustrating a multilayer ceramic capacitor according to an exemplary embodiment of the present inventive concept. FIG. 2 is a perspective view illustrating a ceramic body of the multilayer ceramic capacitor of FIG. 1A in a state in which the ceramic body is inverted. FIG. 3 is a separate perspective view schematically illustrating a stacked structure of internal electrodes in the multilayer ceramic capacitor of FIG. 1A. FIG. 4A and FIG. 4B are cross-sectional views respectively illustrating the multilayer ceramic capacitor of FIG. 1A.

Referring to FIGS. 1A through 4B, a multilayer ceramic capacitor 100 according to the exemplary embodiment may include a ceramic body 110 in which a plurality of dielectric layers 111 are stacked in the width direction, an active region including a plurality of first and second internal electrodes 121 and 122, first, second and third external electrodes 131, 132 and 133, and an insulating layer 150.

The multilayer ceramic capacitor 100 according to the exemplary embodiment may be a three-terminal vertical multilayer capacitor having a total of three external terminals and including internal electrodes stacked therein and disposed perpendicularly with respect to amounting surface of a board.

The ceramic body 110 may have first and second surfaces S1 and S2 opposing each other in the thickness direction, third and fourth surfaces S3 and S4 connecting the first and second surfaces S1 and S2 and opposing each other in the length direction, and fifth and sixth surfaces S5 and S6 opposing each other in the width direction.

Hereinafter, in the exemplary embodiment, a mounting surface of the multilayer ceramic capacitor 100 may be the first surface S1 of the ceramic body 110.

The ceramic body 110 as described above may be formed by stacking the plurality of dielectric layers 111 in the width direction and then sintering the stacked dielectric layers 111, and a shape thereof is not particularly limited, but may be a hexahedral shape as illustrated in the accompanying drawings.

The plurality of dielectric layers 111 configuring the ceramic body 110 may be in a sintered state, and boundaries between dielectric layers 111 adjacent to each other may be integrated such that they may not be readily discernible without the use of a scanning electron microscope (SEM).

The dielectric layers 111 may contain a ceramic powder having high permittivity, for example, a barium titanate ($BaTiO_3$)-based powder or a strontium titanate ($SrTiO_3$) based powder, or the like, but the present inventive concept is not limited thereto as long as sufficient capacitance may be obtained.

Furthermore, in addition to the ceramic powder, a ceramic additive, an organic solvent, a plasticizer, a binder, a dispersant, and the like, may be further added to the dielectric layers 111.

The ceramic body 110 as described above may include the active region having the plurality of internal electrodes therein, as a part contributing to capacitance formation of the capacitor, and cover layers 112 and 113 formed on both side surfaces of the active region, respectively, as margin parts in the width direction.

The active region may be formed by repeatedly stacking the plurality of first and second internal electrodes 121 and 122 with the respective dielectric layers 111 interposed therebetween.

The cover layers 112 and 113 may have the same material and configuration as those of the dielectric layers 111 except that internal electrodes are not included therein.

The cover layers 112 and 113 may be formed by stacking a single dielectric layer or at least two dielectric layers on both side surfaces of the active region in the width direction, respectively, and may generally serve to prevent the first and second internal electrodes 121 and 122 from being damaged by physical or chemical stress.

The first and second internal electrodes 121 and 122, electrodes having different polarities, may be formed in the ceramic body 110 and disposed to face each other, with respective dielectric layers 111 interposed therebetween.

The first and second internal electrodes 121 and 122 may be electrically insulated from each other by the dielectric layers 111 disposed therebetween.

In addition, the first and second internal electrodes 121 and 122 may be disposed to be spaced apart from the third and fourth surfaces S3 and S4 of the ceramic body 110 by a predetermined distance in order to prevent the infiltration of an external foreign substance and to increase reliability.

In addition, a material for forming the first and second internal electrodes 121 and 122 is not particularly limited.

For example, the first and second internal electrodes 121 and 122 may be formed using a conductive paste formed of at least one of a noble metal material such as palladium (Pd), a palladium-silver (Pd—Ag) alloy, or the like, nickel (Ni), and copper (Cu).

Further, as a method of printing the conductive paste, a screen printing method, a gravure printing method, or the like, may be used, but the present inventive concept is not limited thereto.

The first and second internal electrodes 121 and 122 may include first and second body portions 121a and 122a overlapping the internal electrodes adjacent thereto to contribute to capacitance formation, and first and second lead portions 121b and 121b' and a third lead portion 122b, regions formed by increasing widths of portions of the first and second body portions 121a and 122a to be extended to the mounting surface of the ceramic body 110.

Upper ends of the first and second body portions 121a and 122a may be extended to be exposed to upper surfaces of the dielectric layers 111. That is, the first and second internal electrodes 121 and 122 may be structured to be exposed to the second surface S2 of the ceramic body 110.

According to such a structure, an area of overlap of the first and second internal electrodes 121 and 122 may be further increased, thereby leading to an increase in capacitance of the multilayer ceramic capacitor 100.

In addition, when the upper ends of the first and second body portions 121a and 122a are exposed to upper surfaces of the dielectric layers 111, a debinder path may be increased to improve reliability.

End portions of the first and second lead portions 121b and 121b' and the third lead portion 122b may be externally exposed to the mounting surface of the ceramic body 110.

In addition, lengths of the first and second lead portions 121b and 121b' and the third lead portion 122b are not limited, but may have lengths shorter than those of the first and second body portions 121a and 122a in the thickness direction in order to increase capacitance.

In the exemplary embodiment, the first and second lead portions 121b and 121b' may be disposed to be spaced apart from each other in the length direction of the ceramic body 110, and may be extended from the first body portion 121a of the first internal electrode 121 to be exposed to the first surface S1, the mounting surface of the ceramic body 110.

The third lead portion 122b may be disposed between the first and second lead portions 121b and 121b', and may be extended from the second body portion 122a of the second internal electrode 122 to be exposed to the first surface S1 of the ceramic body 110.

The first and second external electrodes 131 and 132, electrodes having the same polarity as each other, may be disposed on the first surface S1 of the ceramic body 110 to be spaced apart from each other in the length direction of the ceramic body 110, and may come into contact with the first and second lead portions 121b and 121b' exposed to the first surface S1 of the ceramic body 110, respectively, to thereby be electrically connected thereto.

The first and second external electrodes 131 and 132 may be formed to be extended from the first surface S1 of the ceramic body 110 to portions of the fifth and sixth surfaces S5 and S6 of the ceramic body 110 in the width direction so as to improve adhesion strength.

In addition, as illustrated in FIG. 1B, first and second external electrodes 131' and 132' may be formed to be extended from the first surface S1 of the ceramic body 110 to portions of the third and fourth surfaces S3 and S4 of the ceramic body 110 in the length direction, respectively, in order to improve adhesion strength and to increase electrical connectivity when the capacitor is mounted on a board.

The third external electrode 133, an electrode having a different polarity from that of the first and second external electrodes 131 and 132, may be used as a ground terminal in the exemplary embodiment.

The third external electrode 133 may be disposed between the first and second external electrodes 131 and 132 and come into contact with the third lead portion 122b exposed to the first surface S1 of the ceramic body 110 to thereby be electrically connected thereto.

The third external electrode 133 may be extended from the first surface S1 of the ceramic body 110 to portions of the fifth and sixth surfaces S5 and S6 of the ceramic body 110 in the width direction so as to improve adhesion strength.

In a two-terminal multilayer ceramic capacitor, since external electrodes may be disposed on both opposing surfaces of a ceramic body in a length direction and a current path may be relatively long when an alternating current signal is applied to the external electrodes, a current loop may be further increased and the magnitude of induced magnetic field may be higher, thereby leading to defects such as an increase in inductance.

In the exemplary embodiment, the first, second and third external electrodes 131, 132 and 133 may be disposed on the first surface S1, the mounting surface of the ceramic body 110 in the thickness direction, whereby a current path may be decreased when an alternating current signal is applied to the external electrodes to shorten a current loop, and accordingly, the magnitude of induced magnetic field may be decreased to result in a decrease in inductance (ESL) of the capacitor.

In the exemplary embodiments, widths of the first to third lead portions 121b, 121b' and 122b may be formed narrower than those of the first to third external electrodes 131, 132 and 133.

That is, according to such a structure, all portions of the first to third lead portions 121b, 121b' and 122b exposed to the first surface S1 of the ceramic body 110 may be covered by the first, second and third external electrodes 131, 132 and 133, whereby defects such as short circuits between the internal electrodes, deteriorations in moisture resistance properties due to external foreign substances, or the occurrence of short circuits may be prevented.

Meanwhile, the first, second and third external electrodes 131, 132 and 133 according to the exemplary embodiment may include conductive layers and plating layers.

For example, the first, second and third external electrodes 131, 132 and 133 may include first, second and third conductive layers 131a, 132a, and 133a coming into contact with the lead portions of the internal electrodes disposed in positions corresponding to the conductive layers, respectively, to thereby be connected thereto, first, second and third nickel (Ni) plating layers 131b, 132b, and 133b formed to cover the first to third conductive layers 131a, 132a, and 133a, and first, second and third tin (Sn) plating layers 131c, 132c, and 133c formed to cover the first, second and third nickel plating layers 131b, 132b, and 133b.

In this case, the first, second and third conductive layers 131a, 132a, and 133a may be formed of the same conductive material as that of the first and second internal electrodes 121 and 122.

However, the present inventive concept is not limited thereto. For example, the first, second and third conductive layers 131a, 132a, and 133a may be formed using powder particles of a metal such as copper (Cu), silver (Ag), nickel (Ni), and the like, and may be formed by applying a conductive paste prepared by adding a glass frit to the metal powder particles and then sintering the applied conductive paste.

The insulating layer 150 may be disposed on the second surface S2 opposing the mounting surface of the ceramic body 110, and may cover exposed portions of the first and second body portions 121a and 122a of the first and second internal electrodes 121 and 122 exposed to the second surface S2 opposing the mounting surface of the ceramic body 110, thereby preventing defects such as short circuits between the internal electrodes, deterioration in moisture resistance properties due to external foreign substances, or the occurrence of short circuits.

The insulating layer 150 may be formed of an insulating material such as epoxy or a ceramic slurry, but the present inventive concept is not limited thereto.

In addition, the insulating layer 150 may reduce chipping defects of the ceramic body, capable of occurring in a manufacturing process.

In addition, when the multilayer ceramic capacitor is lifted by bringing a nozzle into contact with an upper surface of the ceramic body in order to use the multilayer ceramic capacitor, the insulating layer 150 may decrease the influence of impacts when the nozzle contacts the ceramic body to thereby improve the durability of a product.

Modified Examples

Figure 5:
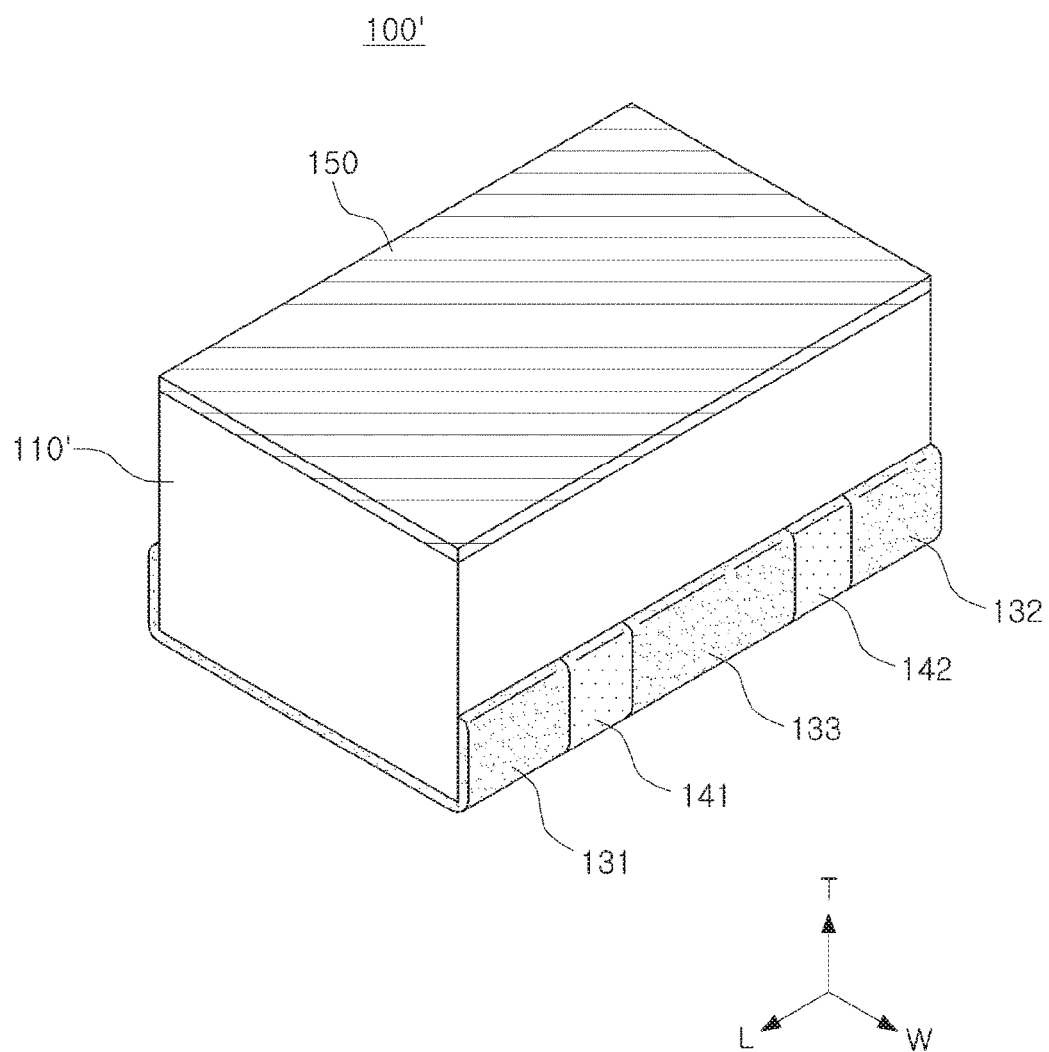
FIG. 5 is a perspective view schematically illustrating a multilayer ceramic capacitor according to another exemplary embodiment of the present inventive concept.
Figure 6A:
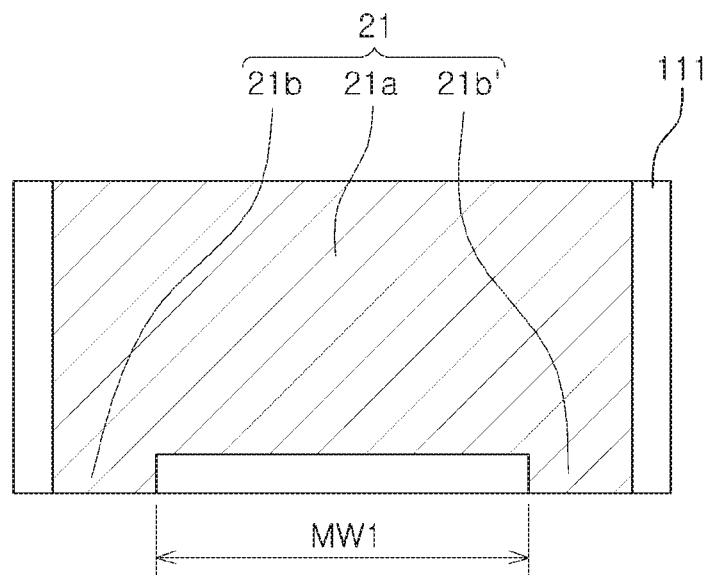
FIGS. 6A and 6B are plan views schematically illustrating structures of first and second internal electrodes in the multilayer ceramic capacitor of FIG. 5.
Figure 6B:
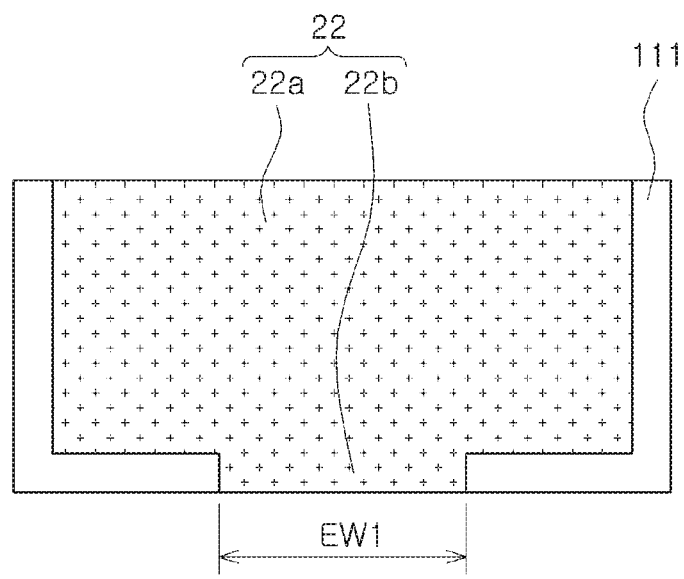
Figure 7A:
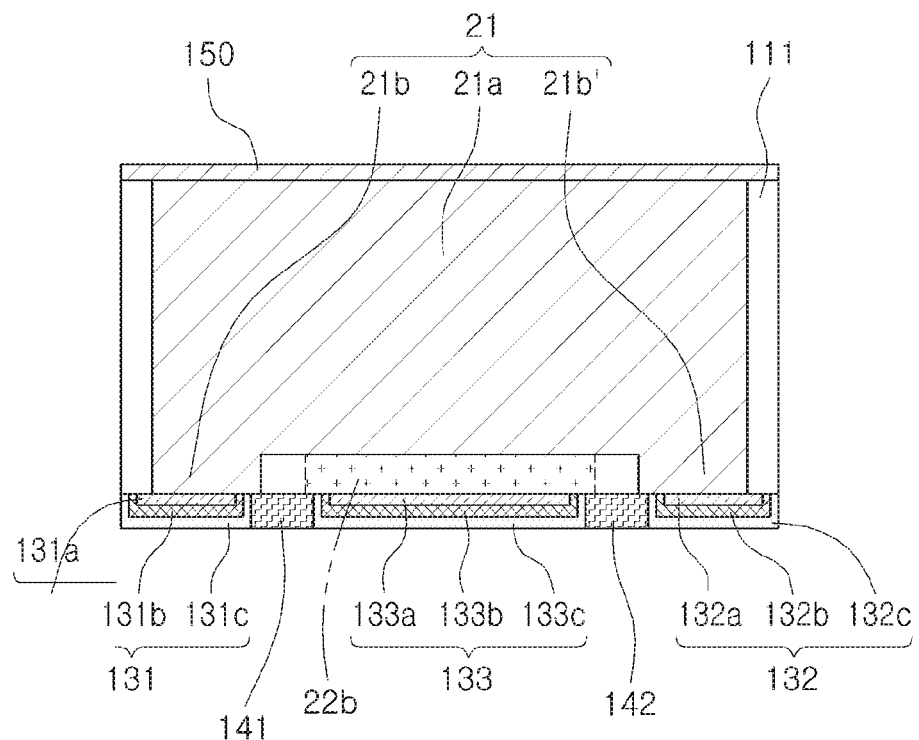
FIGS. 7A and 7B are cross-sectional views respectively illustrating the multilayer ceramic capacitor of FIG. 5.
Figure 7B:
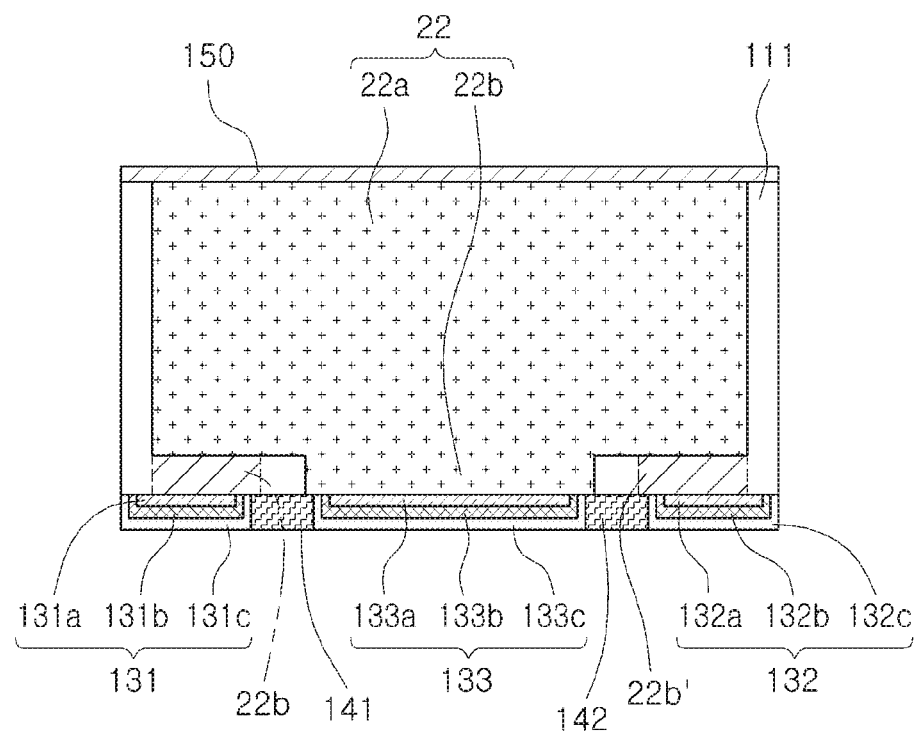

FIG. 5 is a perspective view schematically illustrating a multilayer ceramic capacitor according to another exemplary embodiment of the present inventive concept. FIG. 6A and FIG. 6B are plan views schematically illustrating structures of first and second internal electrodes in the multilayer ceramic capacitor of FIG. 5. FIG. 7A and FIG. 7B are cross-sectional views respectively illustrating the multilayer ceramic capacitor of FIG. 5.

A detailed description of the same structure as that in the above-mentioned exemplary embodiment will be omitted in order to avoid an overlapping description, and first and second lead portions 21b and 21b' of a first internal electrode 21, a third lead portion 22b of a second internal electrode 22, and first and second insulating parts 141 and 142 having different structures from those in the above-mentioned exemplary embodiment will be described in detail.

Referring to FIG. 5 through FIG. 7B, in a multilayer ceramic capacitor 100' according to the exemplary embodiment of the present inventive concept, the first internal electrode 21 may include a first body portion 21a and the first and second lead portions 21b and 21b' extending from the first body portion 21a to be exposed to a first surface S1 of a ceramic body 110', and portions of the first and second lead portions 21b and 21b' exposed outwardly of the ceramic body 110' may not be covered by the first and second external electrodes 131 and 132 and may be exposed to the first surface S1 of the ceramic body 110'.

In addition, the second internal electrode 22 may include a second body portion 22a and the third lead portion 22b extending from the second body portion 22a to be exposed to the first surface S1 of the ceramic body 110', and a portion of the third lead portion 22b exposed outwardly of the ceramic body 110' may not be covered by the third electrode 133 and may be exposed to the first surface S1 of the ceramic body 110'.

In addition, the first and second insulating parts 141 and 142 may be disposed on the first surface S1 of the ceramic body 110' so as to cover the portions of the first, second and third lead portions 21b, 21b' and 22b that are not covered by the first, second and third external electrodes 131, 132 and 133 and are exposed to the first surface S1 of the ceramic body 110'.

The first and second insulating parts 141 and 142 may be formed of an insulating material such as epoxy or ceramic slurry, but the present inventive concept is not limited thereto.

In this case, the first insulating part 141 may be disposed between the first and third external electrodes 131 and 133 on the first surface S1 of the ceramic body 110', and the second insulating part 142 may be disposed between the second and third external electrodes 132 and 133 on the first surface S1 of the ceramic body 110'.

The first and second insulating parts 141 and 142 may cover all of the exposed portions of the first to third lead portions 21b, 21b' and 22b to thereby prevent defects in which portions of the first to third lead portions 21b, 21b' and 22b are exposed outwardly of the ceramic body 110' to cause short circuits between the lead portions, deterioration in moisture resistance properties due to external foreign substances, or the occurrence of short circuits.

The first and second insulating parts 141 and 142 may be formed to be extended from the first surface S1 of the ceramic body 110' to portions of the fifth and sixth surfaces S5 and S6 of the ceramic body 110' in the width direction so as to improve adhesion strength.

Figure 8:
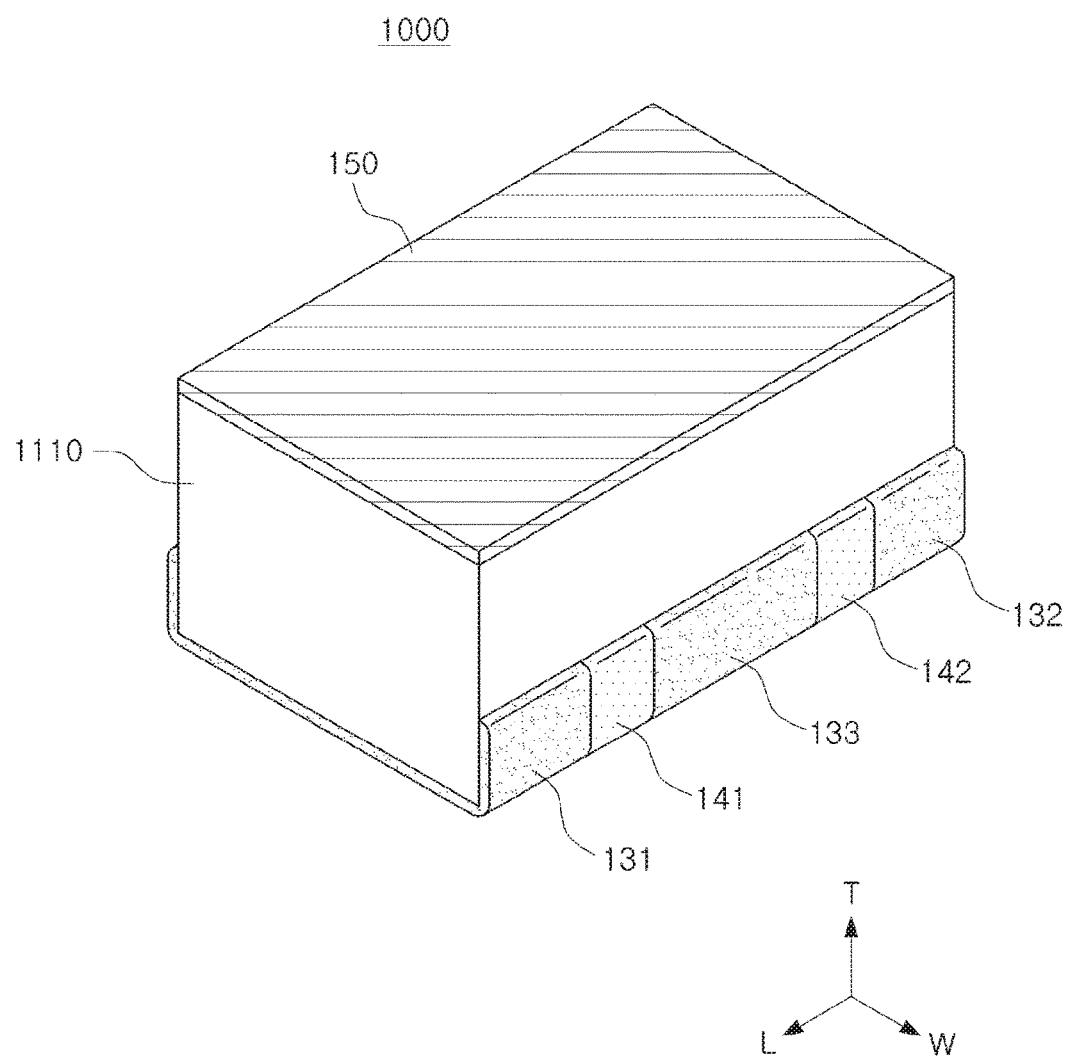
FIG. 8 is a perspective view schematically illustrating a multilayer ceramic capacitor according to another exemplary embodiment of the present inventive concept.
Figure 9A:
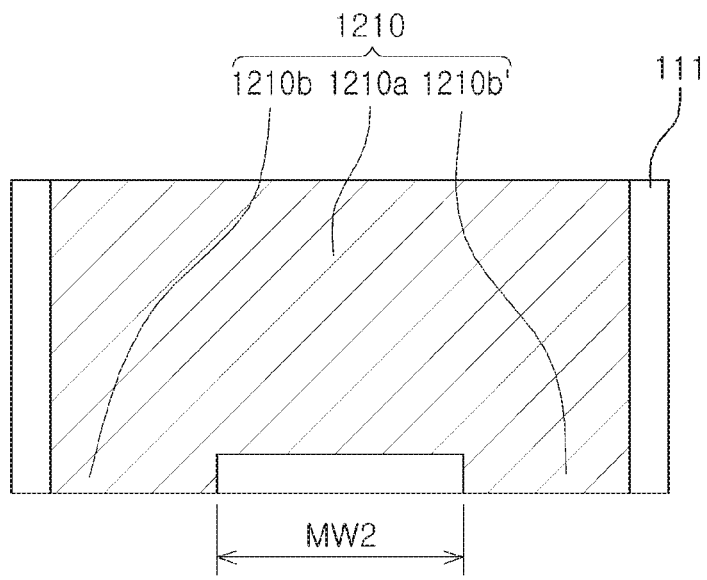
FIGS. 9A and 9B are plan views schematically illustrating structures of first and second internal electrodes in the multilayer ceramic capacitor of FIG. 8.
Figure 9B:
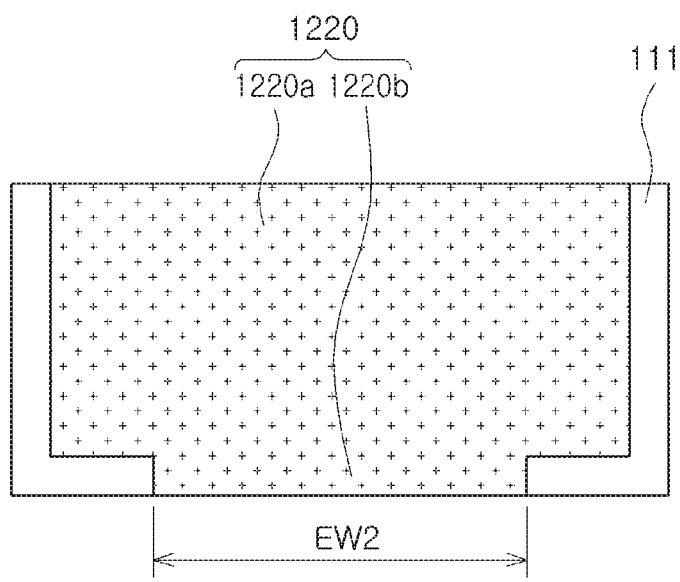
Figure 10A:
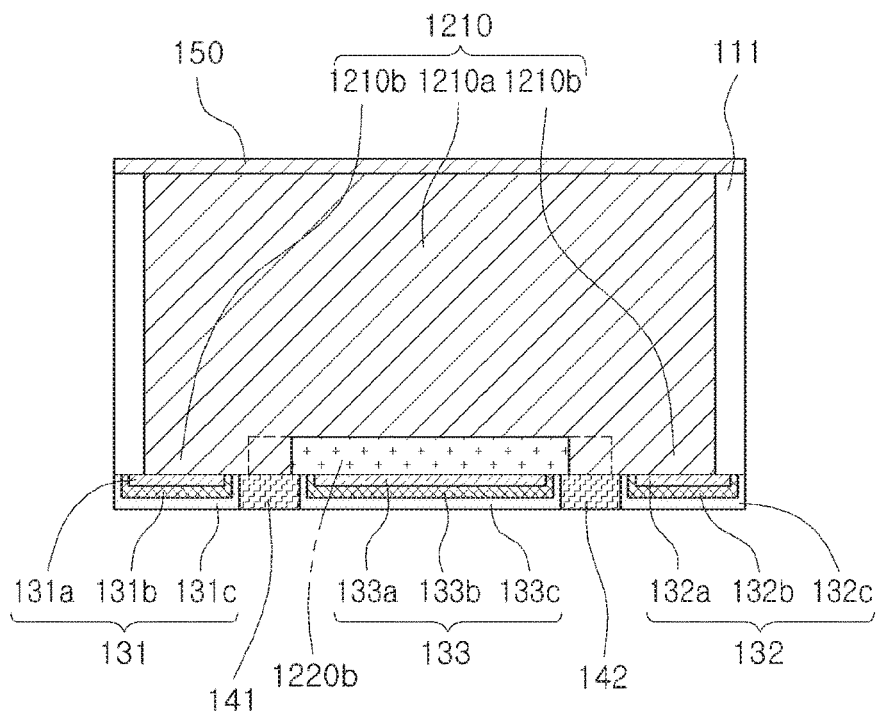
FIGS. 10A and 10B are cross-sectional views respectively illustrating the multilayer ceramic capacitor of FIG. 8.
Figure 10B:
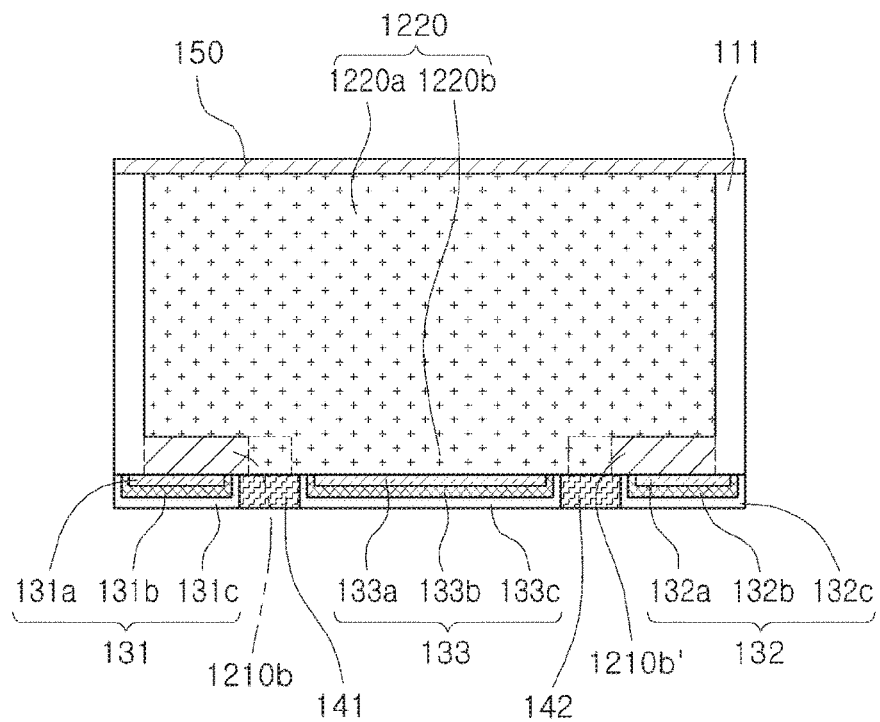

FIG. 8 is a perspective view schematically illustrating a multilayer ceramic capacitor according to another exemplary embodiment of the present inventive concept. FIG. 9A and FIG. 9B are plan views schematically illustrating structures of first and second internal electrodes in the multilayer ceramic capacitor of FIG. 8. FIG. 10A and FIG. 10B are cross-sectional views respectively illustrating the multilayer ceramic capacitor of FIG. 8.

A detailed description of the same structure as that in the above-mentioned exemplary embodiment will be omitted in order to avoid an overlapping description, and first and second lead portions 1210b and 1210b' of a first internal electrode 1210 and a third lead portion 1220b of a second internal electrode 1220 having different structures from those in the above-mentioned exemplary embodiment will be described in detail.

Referring to FIG. 8 through FIG. 10B, in a multilayer ceramic capacitor 1000 according to the exemplary embodiment of the present inventive concept, the first internal electrode 1210 may include a first body portion 1210a and first and second lead portions 1210b and 1210b' extended from the first body portion 1210a to be exposed to a first surface S1 of a ceramic body 1110. Portions of the first and second lead portions 1210b and 1210b' exposed outwardly of the ceramic body 1110 may not be covered by the first and second external electrodes 131 and 132 and may be exposed to the first surface S1 of the ceramic body 1110.

In addition, the second internal electrode 1220 may include a second body portion 1220a and the third lead portion 1220b extended from the second body portion 1220a to be exposed to the first surface S1 of the ceramic body 1110, and a portion of the third lead portion 1220b exposed outwardly of the ceramic body 1110 may not be covered by the third electrode 133 and may be exposed to the first surface S1 of the ceramic body 1110.

In addition, the first and second insulating parts 141 and 142 may be disposed on the first surface S1 of the ceramic body 1110 so as to cover the portions of the first, second and third lead portions 1210b, 1210b' and 1220b that are not covered by the first, second and third external electrodes 131, 132 and 133 and are exposed to the first surface S1 of the ceramic body 1110.

However, in the exemplary embodiment of FIG. 5 through FIG. 7B, a gap MW1 between the first and second lead portions 21b and 21b' may be formed to be greater than a length EW1 of the third lead portion 22b, and accordingly, the first and second lead portions 21b and 21b' and the third lead portion 22b may not overlap each other in a direction in which the first and second internal electrodes 21 and 22 are stacked.

In the exemplary embodiment of FIG. 8 through FIG. 10B, a gap MW2 between the first and second lead portions 1210b and 1210b' may be formed to be narrower than a length EW2 of the third lead portion 1220b.

Accordingly, portions of the first and second lead portions 1210b and 1210b' and a portion of the third lead portion 1220b may overlap each other in a direction in which the first and second internal electrodes 1210 and 1220 are stacked, whereby the overall area of overlap of the first and second internal electrodes 1210 and 1220 may be increased, thereby leading to an increase in capacitance of the multilayer ceramic capacitor 1000.

Board Having Multilayer Ceramic Capacitor

Figure 11:
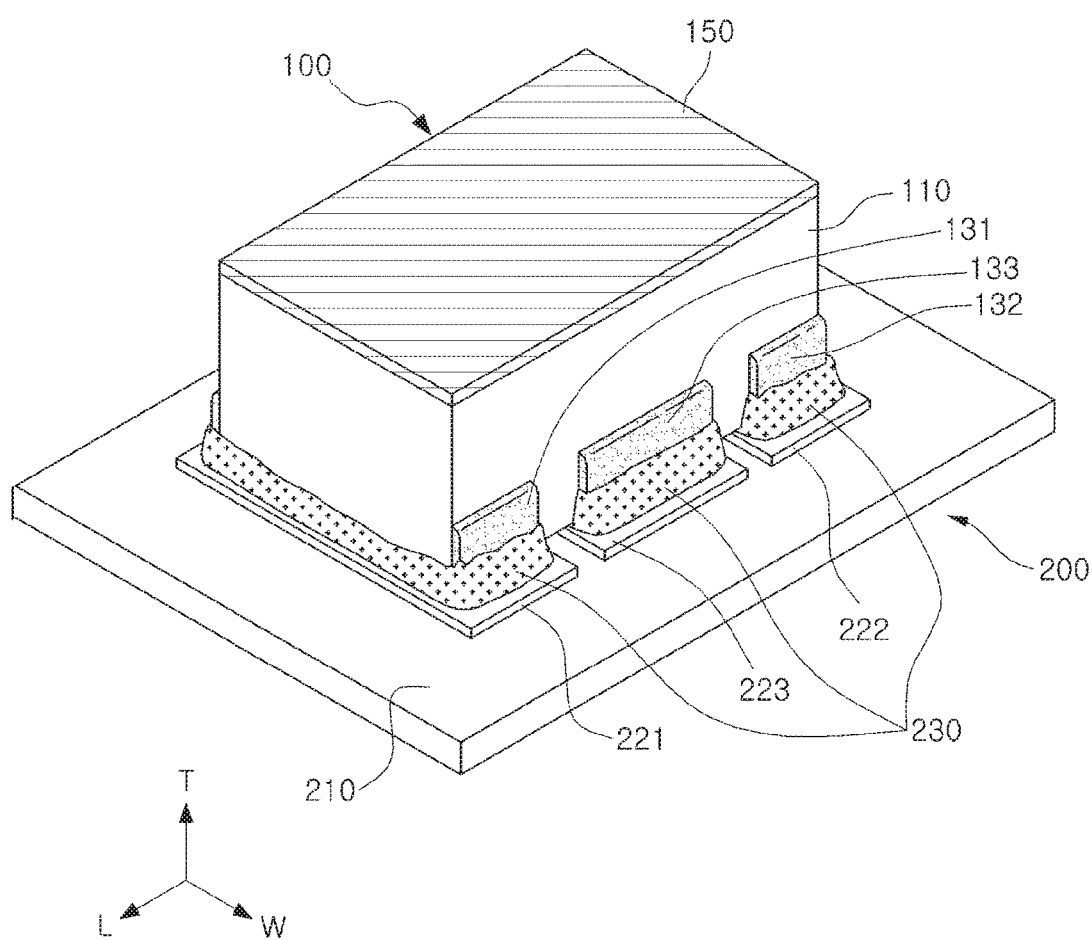
FIG. 11 is a perspective view illustrating a manner in which the multilayer ceramic capacitor of FIG. 1A is mounted on a board.
Figure 12:
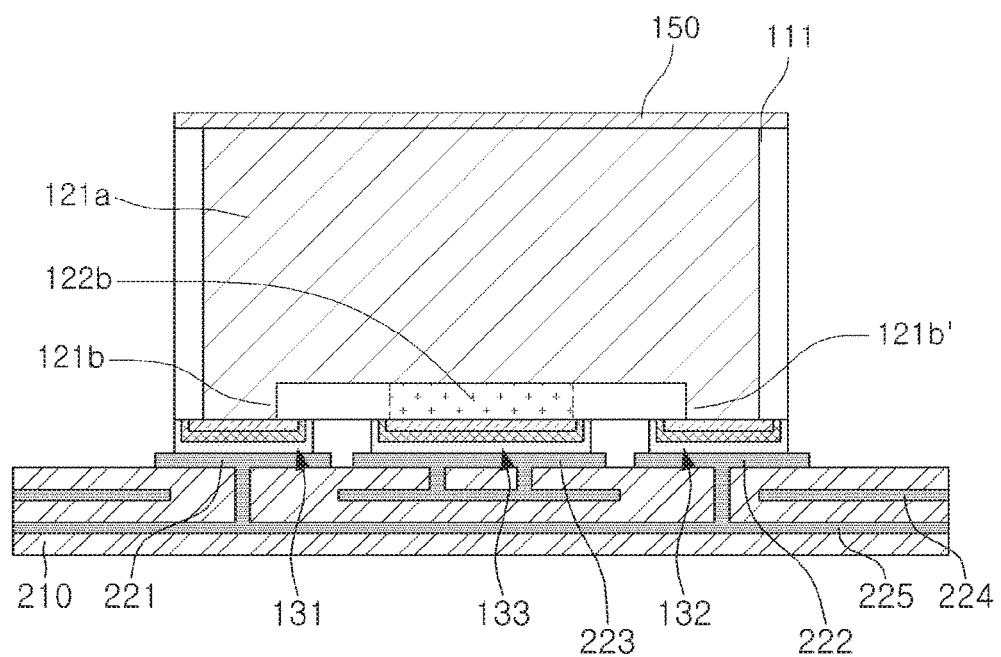
FIG. 12 is a cross-sectional view of FIG. 11.

FIG. 11 is a perspective view illustrating an exemplary embodiment in which the multilayer ceramic capacitor of FIG. 1A is mounted on a board. FIG. 12 is a cross-sectional view of FIG. 11.

Referring to FIGS. 11 and 12, a board 200 having a multilayer ceramic capacitor according to the exemplary embodiment may include a substrate 210 on which the multilayer ceramic capacitor 100 is mounted and first, second and third electrode pads 221, 222 and 223 formed on an upper surface of the substrate 210 to be spaced apart from one another.

In this case, the multilayer ceramic capacitor 100 may be electrically connected to the substrate 210 by soldering portions 230 in a state in which first, second and third external electrodes 131, 132, and 133 are respectively positioned on the first, second and third electrode pads 221, 222 and 223 to come into contact therewith.

In FIG. 12, a ground terminal 224 and a power terminal 225 are shown.

Although the case in which the multilayer ceramic capacitor of FIG. 1A is mounted is described in the exemplary embodiment, the present inventive concept is not limited thereto. For example, the multilayer ceramic capacitor shown in FIG. 1B, FIG. 5 or FIG. 8 may be mounted on a board in a similar manner to the above case, such that boards having a multilayer ceramic capacitor may be configured.

As set forth above, according to exemplary embodiments of the present inventive concept, ESL characteristics may be reduced by a three-terminal vertical multilayer structure, and an area of overlap of the first and second internal electrodes may be increased to thereby allow for an increase in capacitance of the multilayer ceramic capacitor.

While exemplary embodiments have been shown and described above, it will be apparent to those skilled in the art that modifications and variations could be made without departing from the scope of the invention as defined by the appended claims.

What is claimed is:

1. A multilayer ceramic capacitor comprising:
a ceramic body having a plurality of dielectric layers stacked therein, and including an active region including first and second internal electrodes alternately disposed with at least one among the plurality of dielectric layers interposed therebetween,
the first and second internal electrodes exposed to a second surface of the ceramic body opposing a mounting surface of the ceramic body,
wherein the first internal electrodes include first and second lead portions to be extended and exposed to a mounting surface of the ceramic body, and disposed to be spaced apart from each other in a length direction of the ceramic body;
and the second internal electrodes include a third lead portion to be extended and exposed to the mounting surface of the ceramic body, and disposed between the first and second lead portions in the length direction of the ceramic body;
first and second external electrodes disposed on the mounting surface of the ceramic body to be spaced apart from each other in the length direction of the ceramic body, and connected to the first and second lead portions, respectively;
a third external electrode disposed between the first and second external electrodes on the mounting surface of the ceramic body, and connected to the third lead portion, and
an insulating layer disposed on the surface opposing the mounting surface of the ceramic body,
wherein the insulating layer covers an entirety of surfaces of the first and second internal electrodes exposed to the second surface of the ceramic body,
the insulating layer and the ceramic body are made of different materials,
portions of the first, second and third lead portions are not covered by the first, second and third external electrodes and are exposed to the mounting surface of the ceramic body,
a first insulating part is disposed between the first and third external electrodes and a second insulating part is disposed between the second and third external electrodes,
a length of a gap between the first and second lead portions is narrower than a length of the third lead portion, and
the insulating layer includes an epoxy.

2. The multilayer ceramic capacitor of claim 1, wherein the dielectric layers and the internal electrodes are stacked in a width direction of the ceramic body.

3. The multilayer ceramic capacitor of claim 1, wherein widths of the first to third lead portions are formed to be narrower than those of the first to third external electrodes.

4. The multilayer ceramic capacitor of claim 1, wherein the first, second and third external electrodes are formed to cover all portions of the first, second and third lead portions exposed to the mounting surface of the ceramic body.

5. The multilayer ceramic capacitor of claim 1, wherein the first electrode includes a first body portion exposed to the second surface of the ceramic body,
the second electrode includes a second body portion exposed to the second surface of the ceramic body,
an entirety of one side of the first body portion is exposed to the second surface of the ceramic body, and
an entirety of one side of the second body portion is exposed to the second surface of the ceramic body.

6. The multilayer ceramic capacitor of claim 1, wherein the first and second lead portions and the third lead portion do not overlap each other in a direction in which the internal electrodes are stacked.

7. The multilayer ceramic capacitor of claim 1, wherein portions of the first and second lead portions and a portion of the third lead portion overlap each other in a direction in which the internal electrodes are stacked.

8. The multilayer ceramic capacitor of claim 1, wherein a length of a gap between the first and second lead portions is greater than a length of the third lead portion.

9. The multilayer ceramic capacitor of claim 1, wherein the first and second internal electrodes are disposed to be spaced apart from both surfaces of the ceramic body in the length direction.

10. The multilayer ceramic capacitor of claim 1, further comprising: cover layers respectively disposed on both surfaces in the width direction.

11. The multilayer ceramic capacitor of claim 1, wherein the first, second and third external electrodes extend from the mounting surface of the ceramic body to portions of both surfaces of the ceramic body in a width direction.

12. The multilayer ceramic capacitor of claim 1, wherein the first and second external electrodes extend from the mounting surface of the ceramic body to portions of first and second surfaces of the ceramic body in the length direction, respectively.

13. The multilayer ceramic capacitor of claim 1, wherein the first and second insulating parts extend from the mounting surface of the ceramic body to portions of both surfaces of the ceramic body in a width direction.

14. The multilayer ceramic capacitor of claim 1, wherein the external electrodes comprise conductive layers, nickel (Ni) plating layers covering the conductive layers, and tin (Sn) plating layers covering the nickel plating layers.

15. A board having a multilayer ceramic capacitor comprising:
   a substrate having first, second and third electrode pads formed on the substrate; and
   the multilayer ceramic capacitor of claim 1 having the first, second and third external electrodes disposed on the first, second and third electrode pads, respectively.

16. A multilayer ceramic capacitor comprising:
   a ceramic body having a plurality of dielectric layers stacked therein, and including first and second internal electrodes alternately disposed with at least one among the plurality of dielectric layers interposed therebetween;
   the first internal electrodes including first and second lead portions exposed to a mounting surface of the ceramic body,
   and disposed to be spaced apart from each other in a length direction of the ceramic body,
   and a first body portion exposed to a second surface of the ceramic body opposing the mounting surface;
   the second internal electrodes including a third lead portion exposed to the mounting surface of the ceramic body,
   and disposed between the first and second lead portions in the length direction of the ceramic body,
   and a second body portion exposed to the second surface of the ceramic body;
   first and second external electrodes disposed on the mounting surface of the ceramic body to be spaced apart from each other in the length direction of the ceramic body, and connected to the first and second lead portions, respectively;
   a third external electrode disposed between the first and second external electrodes on the mounting surface of the ceramic body, and connected to the third lead portion;
   an insulating layer disposed on the second surface of the ceramic body; and
   a first insulating part disposed between the first and third external electrodes and a second insulating part disposed between the second and third external electrodes,
   wherein the insulating layer covers an entirety of surfaces of the first and second internal electrodes exposed to the second surface of the ceramic body,
   the insulating layer and the ceramic body are made of different materials,
   a length of a gap between the first and second lead portions is less than a length of the third lead portion, and
   the insulating layer includes an epoxy.

17. The multilayer ceramic capacitor of claim 16, wherein an entirety of one side of the first body portion is exposed to the second surface of the ceramic body, and
   an entirety of one side of the second body portion is exposed to the second surface of the ceramic body.

* * * * *